(12) United States Patent
Neki

(10) Patent No.: US 7,192,848 B2
(45) Date of Patent: Mar. 20, 2007

(54) METHOD FOR MANUFACTURING MESA SEMICONDUCTOR DEVICE

(75) Inventor: Ryuichi Neki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 257 days.

(21) Appl. No.: 11/057,188

(22) Filed: Feb. 15, 2005

(65) Prior Publication Data
US 2005/0181580 A1    Aug. 18, 2005

(30) Foreign Application Priority Data
Feb. 16, 2004 (JP) .............................. 2004-038177

(51) Int. Cl.
*H01L 21/00* (2006.01)
(52) U.S. Cl. ............... 438/465; 438/113; 438/460; 438/700; 438/704; 438/758
(58) Field of Classification Search ........ 438/113–114, 438/460, 459, 455, 458, 465, 478, 479, 496, 438/689, 691, 696, 700, 704, 758
See application file for complete search history.

(56) References Cited

U.S. PATENT DOCUMENTS 4,179,794 A * 12/1979 Kosugi et al. .............. 438/465
6,221,751 B1 * 4/2001 Chen et al. ................. 438/612
6,316,287 B1 * 11/2001 Zandman et al. ........... 438/113
6,429,095 B1 * 8/2002 Sakaguchi et al. .......... 438/458
6,696,353 B2 * 2/2004 Minn et al. ................. 438/462

FOREIGN PATENT DOCUMENTS

| JP | 56-058232 | 5/1981 |
|----|-----------|--------|
| JP | 01-232719 | 9/1989 |

* cited by examiner

*Primary Examiner*—Tarifur Chowdhury
*Assistant Examiner*—Jenny L Wagner
(74) *Attorney, Agent, or Firm*—Rabin & Berdo, PC

(57) ABSTRACT

A semiconductor element is formed by forming at least one p-n junction on a semiconductor wafer (1), a recess (8) is formed around the semiconductor element by etching, an insulating film (5) is formed on a surface of the recess, and a metal film (6a) is deposited, by sputtering or vacuum evaporation, on a surface of an exposed semiconductor layer (4) and the insulating film (5) on the semiconductor wafer. And after improving an adhesion between the semiconductor layer and the metal film by a thermal treatment, the metal film on the insulating film is removed selectively by blasting high pressured water on the surface of the semiconductor wafer. Consequently, a mesa semiconductor chip is obtained by cutting the semiconductor wafer under the recess. As a result, an electrode of the mesa semiconductor device obtained by the above method is formed uniformly on a surface of the semiconductor layer and is not formed on the insulating film.

9 Claims, 2 Drawing Sheets ially, the present invention relates to a method for manufacturing a mesa semiconductor device on a surface of which a metal film wiring pattern for an electrode pad is formed. More specifically, the present invention relates to a method for manufacturing a mesa semiconductor device in which a metal film wiring pattern can be formed in a uniform thickness and a desired pattern.

BACKGROUND OF THE INVENTION

In a mesa semiconductor device by the prior art, as for methods depositing a metal film wiring pattern for an electrode pad on a surface of the semiconductor device, the following methods are well-known; a method depositing a metal film on a desired area by an electroplating process, and a method in which a metal film is deposited on a whole surface of a wafer by a sputtering process or a vacuum evaporation process, and successively retained on a predetermined area by patterning in a photolithographic process.

For example, as shown in FIG. 3A, a recess is formed at an area for separating a wafer into pellets in which a p-n junction is formed by p-type layer 22 laminated on an n-type semiconductor substrate 21, and an insulating film 23 such as a passivation film or the like is formed by depositing $SiO_2$ film or sintering glass paste coated on the recess surface, and thereafter two electrodes 24, 25 are formed by depositing films on a surface of the semiconductor layer 22 and the reverse side surface of the semiconductor substrate 21 by an electroplating process. In this case, an electrode 24 of a face side is provided on not only the surface of the semiconductor layer 22 but also the insulating film 23 with a hang of an electroplated metal, whereby a problem of increasing a strayed capacitance or an electrical static damage on a side of mesa structure occurs more easily. In order to solve these kinds of problems, it is also suggested to form an exposed area by providing a photo resist film on a surface of the semiconductor layer 22 and form a metal film only on the exposed area by an electroplating method (cf. Japanese Unexamined Patent Publication No.HEI1-232719).

Another method is also adopted, such as, as shown in FIG. 3B, depositing metal films 24a and 25 provided on the whole surface of a face and a back of a semiconductor wafer in which a p-n junction is made in a same manner described above, and a part of the metal film 24a and the semiconductor layer 22 are etched with coating a photo resist film not shown, thereby a recess is formed at an area, where a wafer is divided into pellets, to form a mesa structure and an electrode 24, thereafter an insulating film 23 is formed by sintering glass paste or the like coated on the recess surface (cf. Japanese Unexamined Patent Publication No.SHO56-58232).

As described above, in the case of forming the electrode on the surface of the semiconductor wafer which has the recess and the insulating film provided on the recess, when the electrode being deposited on the semiconductor layer surface, a hang of the metal film of the electrode is formed over the insulating film which results in an increase of a strayed capacitance or an electrical static damage.

On the contrary, in the case of forming the electrode on only a desired area by the electroplating method by forming a resist film on the whole surface of the wafer and then exposing only a desired surface of the semiconductor layer except the recess, as the wafer which has recess is liable to warp and the recess makes a surface of the wafer more uneven, so it becomes difficult to make a precise patterning and the electrode accurately on the predetermined area. In the method of depositing a metal film (an electrode) on a desired area by patterning a resist film after forming the recess and the insulating film on the recess, the problem described above occurs similarly in a case of not only the electroplating process but also a sputtering process or a vacuum evaporation.

And in the above case, of forming the recess and the insulating film after depositing the metal film on the whole surface of the semiconductor wafer, when making a thick insulating film especially for a high voltage use, as it is necessary to coat glass paste and sinter it at a temperature from 600° C. to 800° C., so there becomes a problem that normally used material like Al for the electrode can not be applied, because a material of electrode needs to stand a sintering temperature.

Moreover, a metal film by an electroplating has a problem like a deterioration in electric characteristics, for example VF (forward direction voltage drop), caused by a less uniformity of the thickness of metal film within a wafer surface which is induced by a variation in the growing rate of plating, between at a center and an edge of the wafer by movement of plating solution by stirring, depending on a distance between a part of the wafer and a plating electrode which is contacted at a center of the wafer by a point contact, and depending on a concentration of current to an irregular point by a pattern defect in a back surface of the wafer.

SUMMARY OF THE INVENTION

The present invention has been accomplished to solve the problem described above and an object of the invention is to provide a method for manufacturing a mesa semiconductor device wherein a metal for an electrode is provided with a uniform thickness, only on the area where an insulating film is not formed on a surface of the semiconductor layer where a recess is formed, in which a wafer is divided into pellets.

A method for manufacturing a mesa semiconductor device according to the present invention includes the steps of; (a) forming a semiconductor element by forming at least one p-n junction on a semiconductor wafer, (b) forming a recess by etching around the semiconductor element, (c) depositing an insulating film on the recess, (d) depositing a metal film on a surface of an exposed semiconductor layer and the insulating film on the semiconductor wafer, (e) performing a thermal treatment, and then removing the metal film on the insulating film selectively by blasting high pressured water on the surface of the semiconductor wafer, and (f) cutting the semiconductor wafer under the recess.

In the depositing of the metal film a sputtering process or a vacuum evaporation process is applied to obtain a very uniform thickness.

It is preferable that the blasting high pressured water is performed at a pressure from 0.5 MPa to 1.5 MPa, because only the metal film on the insulating film is removed and the metal film on the semiconductor layer is retained depending on a difference in an adhesion strength between of the metal film to the semiconductor layer and of the metal film to the insulating film.

According to the present invention, in stead of removing the metal film on the insulating film by a patterning and etching process, a metal film which is weakly adhesive on the insulating film is removed by an impact power by the blasting with the pressured water. Therefore, the electrode is formed accurately only on the semiconductor layer and has a uniform thickness, even if the wafer is strongly uneven by forming the recess in it, because the metal film on the insulating film can be removed selectively and accurately, due to weak adhesion on the insulating film, and in contrast the metal film on a surface of the semiconductor layer, on which no insulating film is, can not be removed due to strong adhesion and used as an electrode as it is. And in depositing a metal film by adopting a sputtering process or a vacuum evaporation process, the electrode of a uniform thickness is obtained, thereby an excellent semiconductor device having superior electric characteristics like a $V_F$ characteristics is obtained.

DETAILED DESCRIPTION

Figure 1A:
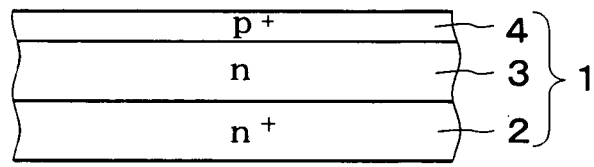
FIG. 1A through 1F are views showing a manufacturing process of an embodiment of a method of manufacturing according to the present invention.

A method of manufacturing a mesa semiconductor device according to the present invention is described in reference to the drawings. The method for manufacturing is as follows, as shown in FIGS. 1A through 1F which are views of manufacturing processes of an embodiment. A semiconductor element is formed by forming at least one p-n junction on a semiconductor wafer 1, a recess 8 is formed around the semiconductor element by etching. And an insulating film 5 is formed on a surface of the recess 8, and a metal film 6a is deposited, by sputtering or vacuum evaporation, on a surface of an exposed semiconductor layer 4 and the insulating film 5 on the semiconductor wafer 1. And after improving an adhesion between the semiconductor layer 4 and the metal film 6a by a thermal treatment, only the metal film on the insulating film 5 is removed selectively by blasting high pressured water on the surface of the semiconductor wafer 1. Consequently, a mesa semiconductor chip is obtained by cutting the semiconductor wafer 1 under the recess 8. A concrete example will be described as follows.

As shown in FIG. 1A, a first step is forming a semiconductor element by forming at least one p-n junction in a semiconductor wafer 1. Example shown in FIGS. 1A through 1F is a case of a mesa diode, in which a diode is formed by forming a p-n junction by growing epitaxially an n-type semiconductor layer 3 and a p-type semiconductor layer 4 on the surface of n$^+$-type semiconductor substrate 2 made of for example silicon. But not limited to this example, a diode which is formed by forming a p-n junction by diffusing impurities into the semiconductor substrate 2 directly can be an object of this invention. And not limited to a diode, semiconductor device of mesa structure like a transistor, a thyristor or the like is also objects of this invention. And further, as for a material of the semiconductor substrate, not limited to a silicon, a compound semiconductor like GaAs or the like can be used.

Figure 1B:
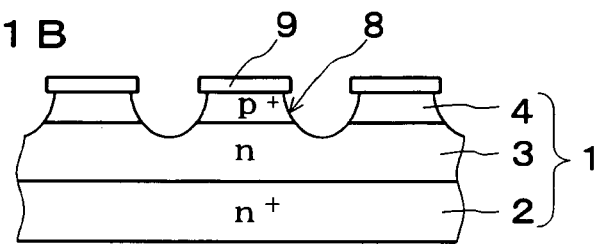

And next step is, as shown FIG. 1B, forming a recess 8 around the semiconductor element by etching an area where the semiconductor wafer 1 is divided into each pellet. In this etching process, for example, a resist film is coated on the whole surface of the semiconductor layer 4, and a mask 9 is made by patterning the resist film so as to expose the area by using a photolithographic technology. Thereafter the semiconductor layers are etched from an exposed surface of the semiconductor layer 4 to the part beyond p-n junction by using an etchant, for example, a mixture of fluoric acid and nitric acid, and the mask 9 is removed after the etching process. As a result, the p-type semiconductor layer 4 projects in a mesa structure.

Figure 1C:
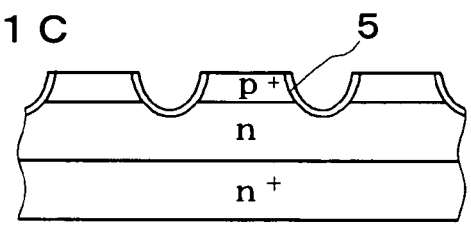

And next step is, as shown in FIG. 1C, depositing an insulating film 5 on a surface of the recess 8. This insulating film 5 is formed, for example, by sintering a glass paste, in which glass powder is suspended in an organic solvent and coated on the surface of the recess 8, at a temperature from 600° C. to 800° C. for a period from 60 minute to 90 minute. Alternatively, the insulating film 5 may be formed by while retaining the mask 9 used for forming the recess 8, depositing a $SiO_2$ film or the like on the whole surface by, for example, CVD method and removing $SiO_2$ film as well as the mask 9 which is provided on the part exept the recess.

Figure 1D:
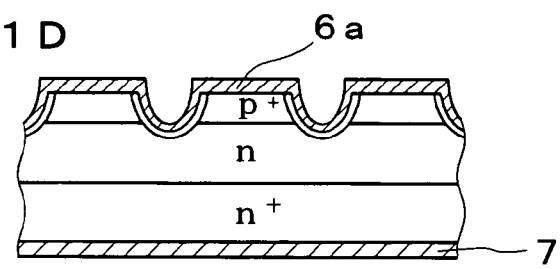
Figure 1E:
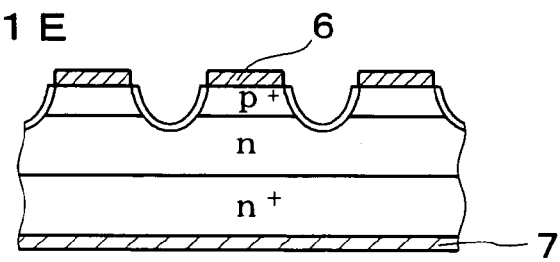

Next step is, as shown in FIG. 1D, depositing a metal film 6a both on the semiconductor layer 4 and the insulating film 5 on the semiconductor wafer by sputtering process or vacuum evaporation process or the like. The metal film 6a is deposited on the whole surface of the semiconductor wafer in a thickness about from 0.5 μm to 3 μm by a normal sputtering process where Al or Ag is sputtered using a target of, for example, Al or Ag. Instead of sputtering process, vacuum evaporation process can be applied in the same way. After this process, turning over the semiconductor wafer 1, an electrode 7 of a backside is formed by a metal film of a thickness from 0.5 μm to 3 μm on the back face of the semiconductor substrate 2. And the electrode 7 on a back surface of the semiconductor substrate 2 can be formed by an electroplating method in stead of sputtering process or vacuum evaporation And a thermal treatment is performed. Serving the thermal treatment promotes an adhesion of the metal film 6a to the semiconductor layer 4. And by blasting high pressured water on the surface of the semiconductor wafer 1, the metal film 6a on the insulating film 5 is removed selectively as shown in FIG. 1E. Concretely, by performing the thermal treatment at a temperature from 400° C. to 500° C. for a period from 30 min. to 90 min. in vacuum atmosphere, the adhesion is promoted by forming a silicide at an interface between the metal film 6a and the semiconductor layer 4. On the other hand, an adhesion of the metal film 6a to the insulating film 5 is not promoted by the thermal treatment, because the insulating film 5 and the metal film 6a does not react.

Figure 2:
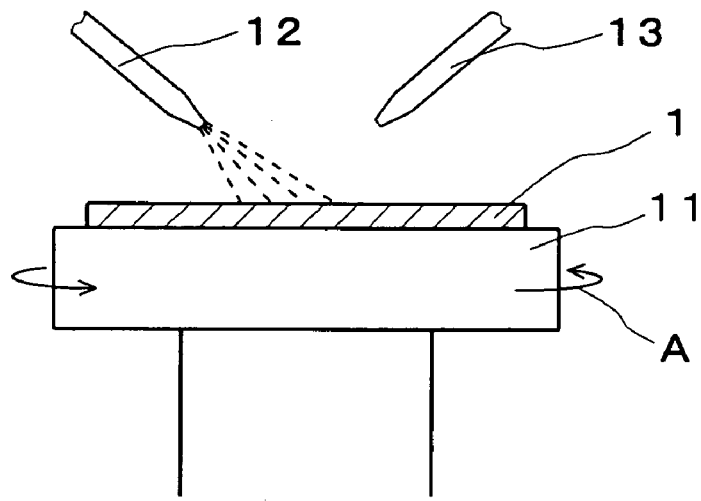
FIG. 2 is a view showing an example of an equipment used in a process shown in FIG. 1E where high pressured water is blasted on a semiconductor wafer.
Figure 3A:
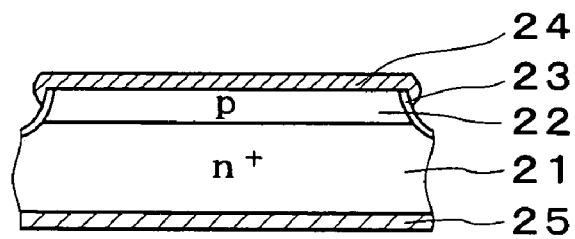
FIGS. 3A and 3B are views showing an example of a mesa semiconductor device in the prior art.
Figure 3B:
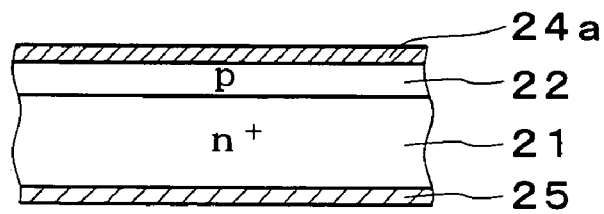
Figure 3B:
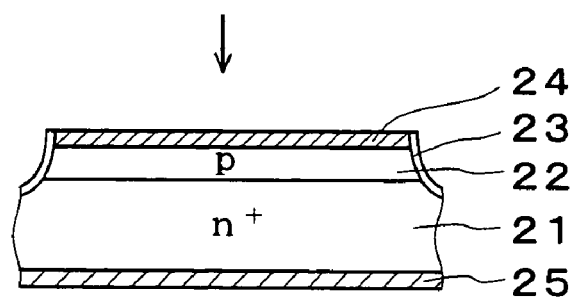

Thereafter, the semiconductor wafer 1 is set on a vacuum chuck stage 11 (for adsorbing the wafer) of a high pressured water blasting equipment shown in FIG. 2. The high pressured water blasting equipment has a vacuum chuck stage 11 which is set so as to rotate in a direction of an arrow shown in FIG. 2, by a rotating function not shown, and a nozzle 12 which is set above the vacuum chuck stage 11 and a tip of which aims at a surface of the vacuum chuck stage. And the water supplied from a water source not shown is blasted with high pressure. This high pressure nozzle is movable by a drive function, not shown, to be moved in a horizontal plane of the vacuum chuck stage 11 on its whole surface. Above the vacuum chuck stage, $N_2$ nozzle 13 is also set so as to blow dried $N_2$ gas.

On the vacuum chuck stage 11 of this equipment, the wafer is set in a surface of the recess upside and treated with following procedure; rotating a vacuum chuck stage, and while moving a high pressure nozzle in the horizontal plane, blasting the high pressured water onto the whole area of the surface of the semiconductor wafer. As a result, the metal film 6a on the insulating film 5 which is less adhesive, is removed selectively by impulsive power of the pressured water, thereby to form finally the electrode 6 only on the semiconductor layer 4. By setting a pressure of the high pressured water in this process in a range from 0.5 MPa to 1.5 MPa, the metal film 6a only on the insulating film 5 can be removed selectively, without any damage in the metal film 6a on the semiconductor layer.

In other words, the present inventor studied and examined about a selective removing of the metal film earnestly and has found that, when a pressure is too low, the metal film 6a on the insulating film 5 can not be removed sufficiently, and when it is too high, the semiconductor wafer gets a damage like a crack or a breakage, or strip between the semiconductor layer 4 and the metal film 6a, and further found that by blasting of the high pressured water in the above pressure, the metal film 6a only on the insulating film 5 can be removed and in the metal on the semiconductor layer any damage has never occurred. After the metal film 6a has been removed, the semiconductor wafer is washed with pure water and dried with a blow of $N_2$ gas.

Figure 1F:
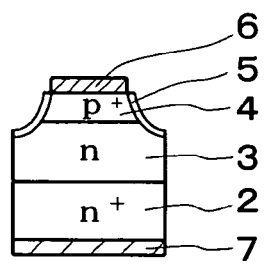

And by cutting the semiconductor wafer 1 under the recess as shown in FIG. 1F, the wafer is separated to each pellet of the mesa semiconductor device and the semiconductor device according to the present invention is obtained. This cutting is processed generally by dicing, but other methods can be applied.

According to the present invention, without using photolithographic process, removing the metal film deposited on whole area of the surface is performed selectively, so the metal film can be formed as an electrode only on the area which is necessary. Therefore, even if it is difficult to make a precise resist film pattern on the wafer, because the surface is extremely uneven including a recess on the semiconductor wafer to make mesa structure, and because a curve (or bow) of the semiconductor wafer caused by sintering the insulating film made of glass or the like, an unnecessary part of the metal film formed on the whole part of the wafer can be removed very accurately.

And more, as a photolithographic process is not used, the process required for photolithographic process (resist coating—exposure—development—baking—metal etching—resist removing) can be omitted and as a result the electrode can be made by a very short process and in a very low cost. Moreover, by depositing a metal film by sputtering process or vacuum evaporation, a very uniform metal film can be provided. Consequently, a semiconductor device which has high characteristics can be obtained, because a problem like a defect in $V_F$ (forward direction voltage drop) caused by a stripping of electrode or a poor adhesion based on non uniform thickness of the metal film is suppressed.

Although preferred examples have been described in some detail it is to be understood that certain changes can be made by those skilled in the art without departing from the spirit and scope of the invention as defined by the appended claims.

What is claimed is:

1. A method for manufacturing a mesa semiconductor device comprising the steps of:
   (a) forming a semiconductor element by forming at least one p-n junction on a semiconductor wafer;
   (b) forming a recess by etching around the semiconductor element;
   (c) depositing an insulating film on the recess;
   (d) depositing a metal film on a surface of an exposed semiconductor layer and the insulating film on the semiconductor wafer;
   (e) performing a thermal treatment, and then removing the metal film on the insulating film selectively by blasting high pressured water on the surface of the semiconductor wafer; and
   (f) cutting the semiconductor wafer under the recess.

2. The method of claim 1, wherein the step (c) further comprises the steps of; coating a glass paste in which a glass powder is suspended in an organic solvent, in the recess, and sintering the glass paste at a temperature from 600° C. to 800° C. for a period from 60 minute to 90 minute.

3. The method of claim 1, wherein the step (c) further comprises the steps of; depositing an insulating film by a CVD method on a whole surface of the semiconductor wafer, while retaining a mask used for forming the recess, and removing the insulating film on the part except the recess by removing the mask.

4. The method of claim 1, wherein the step of depositing the metal film is performed by a sputtering process or a vacuum evaporation process.

5. The method of claim 4, wherein a thickness of the metal film is from 0.5 μm to 3 μm.

6. The method of claim 1, wherein the thermal treatment in the step (e) is performed by heating at a temperature from 400° C. to 500° C. for a period from 30 minute to 90 minute.

7. The method of claim 1, wherein the step of blasting high pressured water is performed at a pressure from 0.5 MPa to 1.5 MPa.

8. The method of claim 1, wherein the step of blasting high pressured water is performed on a whole surface of the semiconductor wafer uniformly with moving a nozzle in a planar motion.

9. The method of claim 1, further comprising, after removing the metal film selectively in the step (e), the steps of; washing the wafer with pure water, and drying with blowing $N_2$ gas.

* * * * *